(12) United States Patent
Kiyono

(10) Patent No.: US 10,298,188 B2
(45) Date of Patent: May 21, 2019

(54) CLASS-D AMPLIFIER

(71) Applicant: Kabushiki Kaisha Toshiba, Minato-ku, Tokyo (JP)

(72) Inventor: Takafumi Kiyono, Ota Gunma (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/691,867

(22) Filed: Aug. 31, 2017

(65) Prior Publication Data

US 2018/0241363 A1 Aug. 23, 2018

(30) Foreign Application Priority Data

Feb. 21, 2017 (JP) ................. 2017-030043

(51) Int. Cl.
*H03F 3/38* (2006.01)
*H03F 3/217* (2006.01)
*H03F 3/185* (2006.01)
*H03F 3/187* (2006.01)
*H03F 3/45* (2006.01)

(52) U.S. Cl.
CPC ........... *H03F 3/2173* (2013.01); *H03F 3/185* (2013.01); *H03F 3/187* (2013.01); *H03F 3/45475* (2013.01); *H03F 2200/03* (2013.01); *H03F 2200/66* (2013.01)

(58) Field of Classification Search
CPC ........... H03F 3/38; H03F 3/217; H03F 3/2171
USPC ....................................... 330/10, 207 A, 251
See application file for complete search history.

(56) References Cited

U.S. PATENT DOCUMENTS

| 7,315,202 | B2 | 1/2008 | Tsuji |
| 7,482,870 | B2 | 1/2009 | Maejima et al. |
| 8,054,129 | B2 | 11/2011 | Maejima |
| 8,299,853 | B2 | 10/2012 | Maejima |
| 2006/0012428 | A1* | 1/2006 | Ohkuri .................... H03F 3/217 330/251 |

FOREIGN PATENT DOCUMENTS

| JP | 4618017 B2 | 1/2011 |
| JP | 4853176 B2 | 1/2012 |
| JP | 5266830 B2 | 8/2013 |

* cited by examiner

*Primary Examiner* — Steven J Mottola
(74) *Attorney, Agent, or Firm* — White & Case LLP

(57) ABSTRACT

A class-D amplifier of an embodiment includes: a PWM modulator configured to output a PWM pulse based on an input signal; a first output transistor group, in which a connection point of complementarily operated two first output transistors is an output end; a second output transistor group, in which a connection point of complementarily operated two second output transistors is connected to the connection point of the first transistors; a driver circuit capable of driving the first output transistors and the second output transistors of the first and second output transistor groups, based on the PWM pulse from the PWM modulator; and a control circuit configured to generate a control signal for operating at least one of the first output transistor group and the second output transistor group.

10 Claims, 11 Drawing Sheets ize-align: center;"># CLASS-D AMPLIFIER

CROSS-REFERENCE TO RELATED APPLICATION

This application is based upon and claims the benefit of priority from the prior Japanese Patent Applications No. 2017-030043, filed on Feb. 21, 2017; the entire contents of which are incorporated herein by reference.

FIELD

Embodiments described herein relate generally to a class-D amplifier.

BACKGROUND

In recent years, as an audio amplifier for a vehicle or the like, a class-D amplifier adopting a PWM modulator has been spreading. The PWM modulator performs pulse width modulation of a sound signal by comparing the sound signal with a carrier of a sawtooth wave (one side edge) or a triangular wave (both side edges). The PWM modulator obtains a PWM pulse which is a binary switching waveform as a result of the pulse width modulation. The class-D amplifier amplifies power by driving an output transistor (switching transistor) by the PWM pulse from the PWM modulator. Power-amplified switching output is demodulated using a low-pass filter and a speaker is driven.

Incidentally, maximum output power is one element that determines a performance of an audio amplifier. In thermal design of a device, power loss at the maximum output power needs to be taken into consideration.

However, when a circuit is designed in consideration of the maximum output power, there is a problem that loss of an output transistor increases and there is an adverse effect of heat generation in normal use during which only the power sufficiently smaller than the maximum output power is consumed.

DETAILED DESCRIPTION

A class-D amplifier of embodiments includes: a PWM modulator including a comparator configured to compare an input signal and a carrier, and configured to output a PWM pulse based on the input signal; a first output transistor group constituted of complementarily operated two first output transistors, a connection point of which is an output end of the two first output transistors; a second output transistor group constituted of complementarily operated two second output transistors, a connection point of which is connected to the connection point of the first transistors; a driver circuit capable of driving the first output transistors and the second output transistors of the first and second output transistor groups, based on the PWM pulse from the PWM modulator; and a control circuit configured to generate a control signal for operating at least one of the first output transistor group and the second output transistor group.

Hereinafter, the embodiments of the present invention will be described in detail with reference to the drawings.

First Embodiment

Figure 1:
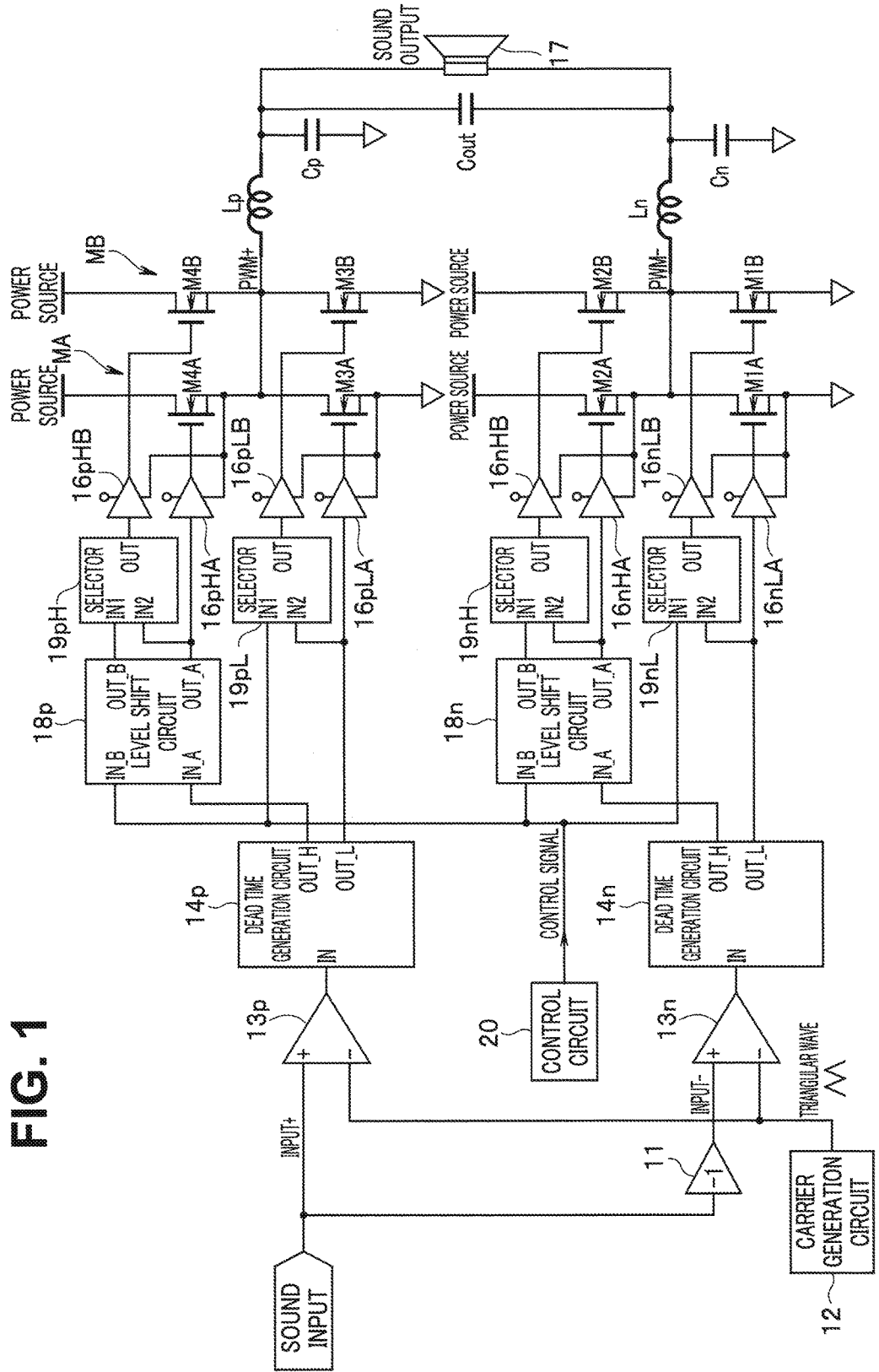
FIG. 1 is a circuit diagram illustrating a class-D amplifier relating to a first embodiment of the present invention.

FIG. 1 is a circuit diagram illustrating a class-D amplifier relating to the first embodiment of the present invention. In addition, FIG. 2 is a circuit diagram illustrating a class-D amplifier relating to a related technology.

The present embodiment reduces loss regardless of an input/output level during practical use by making a transistor size of an output transistor (switching transistor) used in power amplification of the class-D amplifier dynamically changeable.

Figure 3:
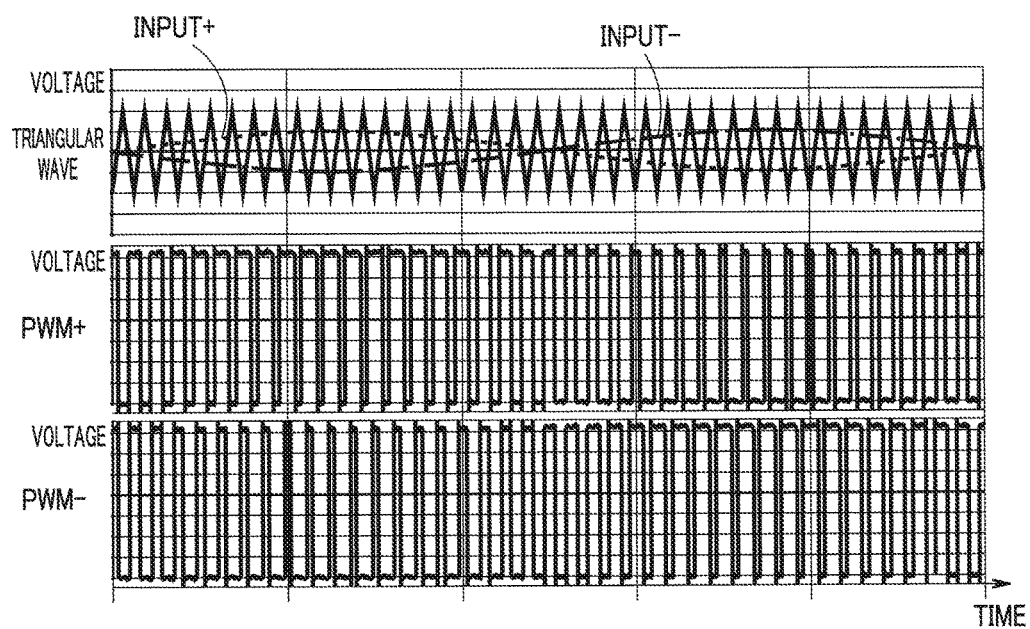
FIG. 3 is a graph illustrating a relation between an inputted sound signal and a triangular wave and positive phase PWM output PWM+ and negative phase PWM output PWM−.
Figure 4:
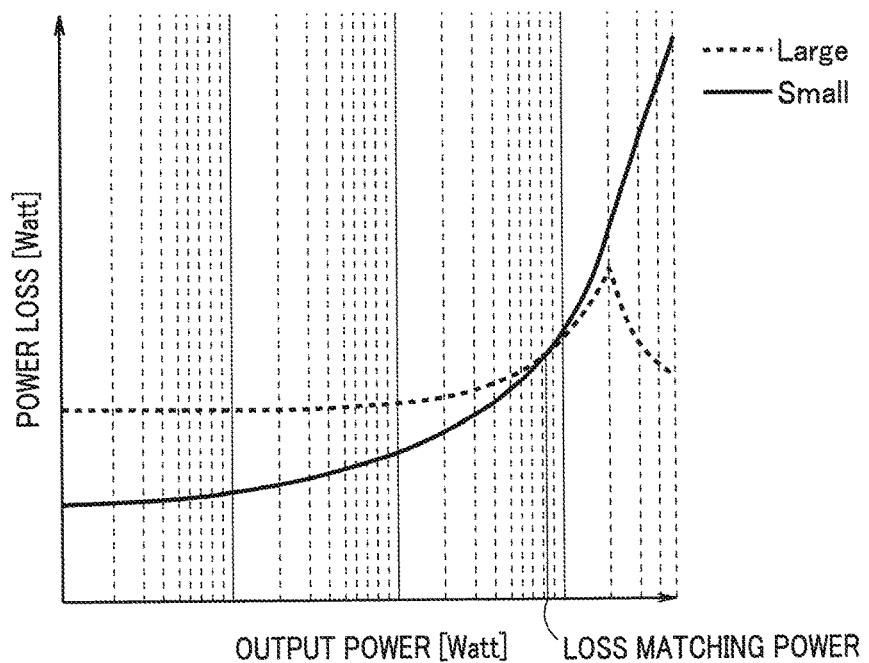
FIG. 4 is a graph representing output power on a horizontal axis, representing power loss on a vertical axis and illustrating a relation between a transistor size and loss.
Figure 5:
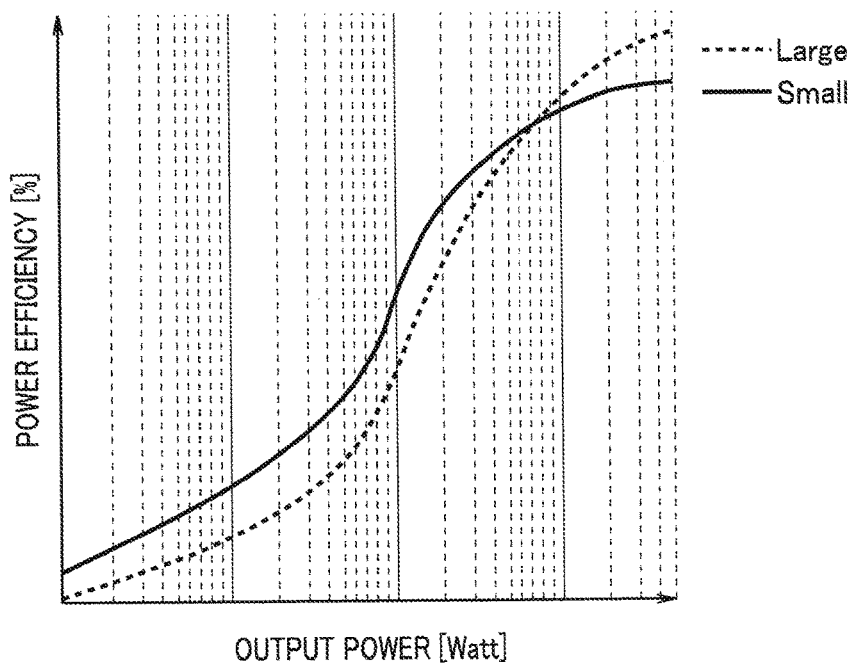
FIG. 5 is a graph representing the output power on the horizontal axis, representing efficiency on the vertical axis and illustrating a relation between the transistor size and the efficiency.

First, with reference to FIG. 2 to FIG. 5, a relation between the transistor size of the output transistor and the loss according to an input level (output level) of the class-D amplifier will be described. FIG. 3 is a graph illustrating a relation between an inputted sound signal and a triangular wave and positive phase PWM output PWM+ and negative phase PWM output PWM−. FIG. 4 is a graph representing output power on a horizontal axis, representing power loss on a vertical axis and illustrating a relation between the transistor size and the loss. FIG. 5 is a graph representing the output power on the horizontal axis, representing efficiency on the vertical axis and illustrating a relation between the transistor size and the efficiency.

Figure 2:
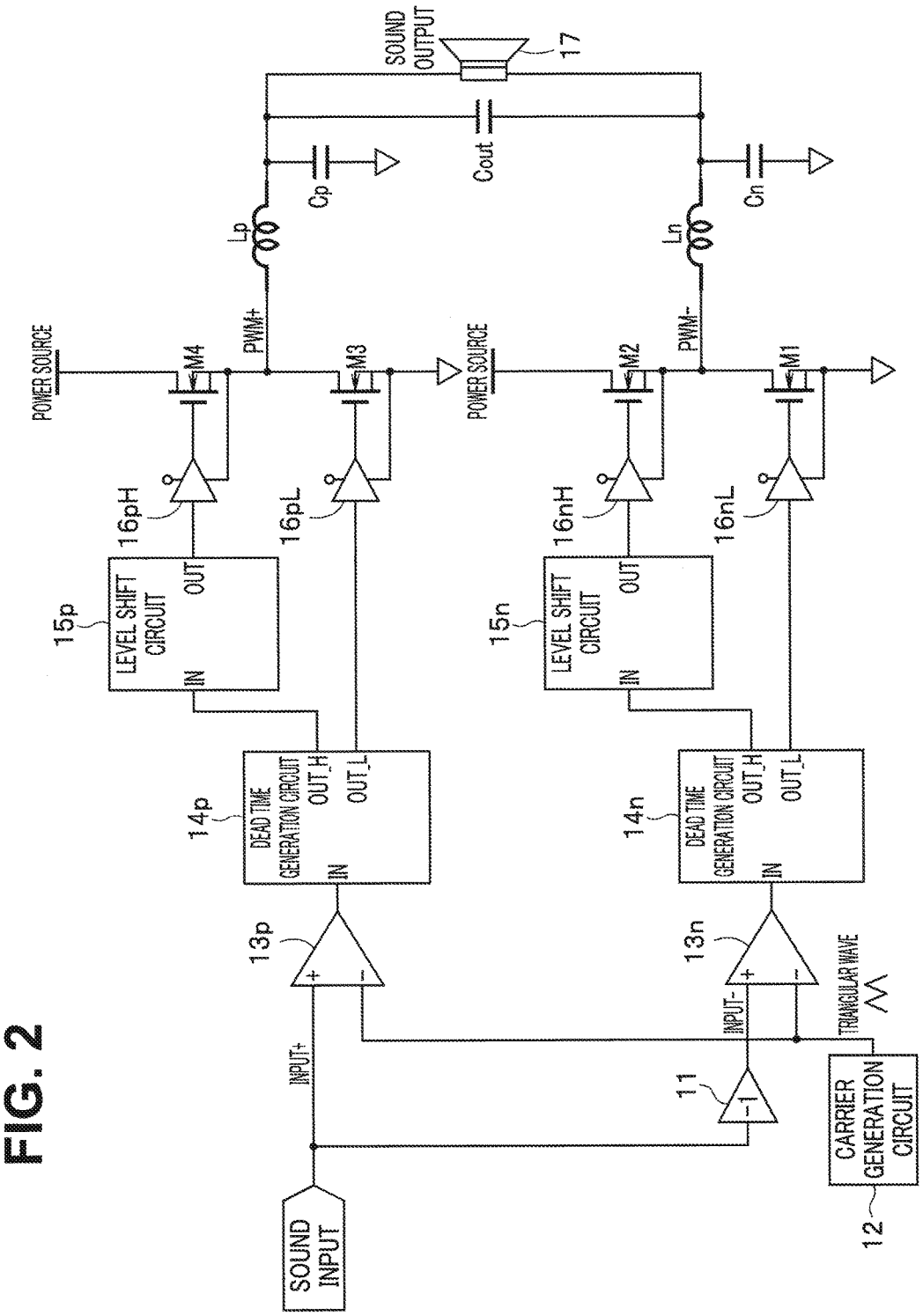
FIG. 2 is a circuit diagram illustrating a class-D amplifier relating to a related technology.

The class-D amplifier in FIG. 2 includes a PWM modulator constituted of an inversion circuit 11, a carrier generation circuit 12, and two comparators 13$p$ and 13$n$. Sound input (INPUT+) is supplied to the inversion circuit 11 and a non-inverting (positive phase) input terminal of the comparator 13$p$. The inversion circuit 11 inverts the sound input, and supplies inverted sound input (INPUT−) to a non-inverting (positive phase) input terminal of the comparator 13$n$. The carrier generation circuit 12 generates the triangular wave of a predetermined frequency as a carrier. The carrier from the carrier generation circuit 12 is supplied to inverting (negative phase) input terminals of the comparators 13$p$ and 13$n$.

The comparator 13$p$ compares the sound input inputted to the non-inverting (positive phase) input terminal and the carrier inputted to the inverting (negative phase) input terminal, and outputs a positive phase PWM pulse which is a comparison result. In addition, the comparator 13$n$ compares the inverted sound input inputted to the non-inverting (positive phase) input terminal and the carrier inputted to the inverting (negative phase) input terminal, and outputs a negative phase PWM pulse which is a comparison result. The positive phase and negative phase PWM pulses become pulses of a duty ratio according to the sound input.

The positive phase PWM pulse from the comparator 13$p$ and the negative phase PWM pulse from the comparator 13$n$ are respectively branched into a high side and a low side and power-amplified. The positive phase PWM pulse from the comparator 13$p$ is supplied to a dead time generation circuit 14$p$, and the negative phase PWM pulse from the comparator 13$n$ is supplied to a dead time generation circuit 14$n$.

The dead time generation circuit 14$p$ provides dead time in the positive phase PWM pulse, outputs a positive phase high side PWM pulse from an OUT_H terminal, and outputs a positive phase low side PWM pulse from an OUT_L terminal, in order to prevent output transistors M3 and M4 to be described later from being simultaneously turned on, causing a through current to flow. Similarly, the dead time generation circuit 14$n$ provides dead time in the negative phase PWM pulse, outputs a negative phase high side PWM pulse from an OUT_H terminal, and outputs a negative phase low side PWM pulse from an OUT_L terminal, in order to prevent output transistors M1 and M2 to be described later from being simultaneously turned on, causing a through current to flow.

The low side PWM pulse from the dead time generation circuit 14$p$ is supplied through a gate driver 16$p$L to a gate of the transistor M3. In addition, the low side PWM pulse from the dead time generation circuit 14$n$ is supplied through a gate driver 16$n$L to a gate of the transistor M1.

Furthermore, the high side PWM pulse from the dead time generation circuit 14$p$ is supplied to a level shift circuit 15$p$. The level shift circuit 15$p$ shifts a level of the high side PWM pulse to a predetermined level, and then supplies the high side PWM pulse through a gate driver 16$p$H to a gate of the transistor M4. In addition, the high side PWM pulse from the dead time generation circuit 14$n$ is supplied to a level shift circuit 15$n$. The level shift circuit 15$n$ shifts a level of the high side PWM pulse to a predetermined level, and then supplies the high side PWM pulse through a gate driver 16$n$H to a gate of the transistor M2.

Between a power source and a reference potential point, a drain/source path of the output transistor M4 and a drain/source path of the output transistor M3 are connected in series. In addition, between the power source and the reference potential point, a drain/source path of the output transistor M2 and a drain/source path of the output transistor M1 are connected in series. The transistors M1-M4 are respectively driven by the gate drivers 16$n$L, 16$n$H, 16$p$L and 16$p$H. The positive phase PWM output PWM+ for which the positive phase PWM pulse is amplified appears at a connection point of a source of the transistor M4 and a drain of the transistor M3, and negative phase PWM output PWM− for which the negative phase PWM pulse is amplified appears at a connection point of a source of the transistor M2 and a drain of the transistor M1.

A power amplification portion is constituted of a circuit part from the dead time generation circuits 14$p$ and 14$n$ to the transistors M4-M1, and a class-D amplifier portion is constituted of the PWM modulator and the power amplification portion. The connection point of the source of the transistor M4 and the drain of the transistor M3 is a positive phase output end of the class-D amplifier portion, and the connection point of the source of the transistor M2 and the drain of the transistor M1 is a negative phase output end of the class-D amplifier portion. Note that the class-D amplifier portion is often made into an IC.

As illustrated in FIG. 3, the PWM output PWM+ for which a sound output level becomes high in a state that the level of the sound input (INPUT+) is near a distal end of the triangular wave that is the carrier, and the sound output level becomes low near a center appears at the positive phase output end. In addition, the PWM output PWM− for which the sound output level becomes high in the state that the level of the inverted sound input (INPUT−) is near the distal end of the triangular wave, and the sound output level becomes low near the center appears at the negative phase output end.

The positive phase output end is connected to the reference potential point through a coil Lp and a capacitor Cp configuring a low-pass filter. In addition, the negative phase output end is connected to the reference potential point through a coil Ln and a capacitor Cn configuring a low-pass filter. By the low-pass filters, a carrier component is removed from the PWM output PWM+ appearing at the positive phase output end and the PWM output PWM− appearing at the negative phase output end, and the sound signal is restored.

Between the connection point of the coil Lp and the capacitor Cp (the positive phase output end of the class-D amplifier) and the connection point of the coil Ln and the capacitor Cn (the negative phase output end of the class-D amplifier), a capacitor Cout is connected. Between the positive phase output end and the negative phase output end, a speaker 17 which is a load is connected.

In a case that the positive phase PWM pulse is at the predetermined level or higher, the transistors M4 and M1 are turned on, and a current flows from the positive phase output end through the speaker 17 to the negative phase output end. In addition, in the case that the positive phase PWM pulse is lower than the predetermined level, the transistors M2 and M3 are turned on, and the current flows from the negative phase output end through the speaker 17 to the positive phase output end. In this way, the sound signal based on the PWM output PWM+ appearing at the positive phase output end and the PWM output PWM− appearing at the negative phase output end appears at both ends of the capacitor Cout, and the speaker 17 is driven by the sound signal. The speaker 17 outputs the sound signal based on a sound input signal.

Incidentally, in thermal design of a device, the loss of the output transistor needs to be taken into consideration. That is, in the output transistors M1-M4, loss (conduction loss) due to on-resistance and loss (gate drive loss) due to parasitic capacitance need to be taken into consideration. When an output current flowing to the positive phase output end and the negative phase output end is defined as IOUT_RMS and the on-resistance of the transistors M1, M2, M3 and M4 is defined as RDS, conduction loss PCOND can be indicated by a following equation (1).

$$PCOND = IOUT\_RMS^2 \times RDS \quad (1)$$

On the other hand, when a gate charge capacitance of the transistors M1-M4 is defined as Qg, gate drive loss PGATE can be indicated by a following equation (2). Note that VDRIVE is a drive voltage of the gate driver and FSW is a switching frequency of the output transistor.

$$PGATE = 2 \times Qg \times VDRIVE \times FSW \quad (2)$$

The on-resistance of the transistor can be lowered by increasing a transistor size (gate width). Therefore, the transistor size of the transistors M1-M4 may be increased in order to reduce the conduction loss PCOND in the above-described equation (1). However, it is contradictory that, when the transistor size is increased, the gate charge capacitance Qg becomes large, and the gate drive loss PGATE in the above-described equation (2) increases.

FIG. 4 illustrates a characteristic of the power loss in the case that the transistor size is relatively small with a solid line (Small), and illustrates the characteristic of the power loss in the case that the transistor size is relatively large with a broken line (Large). In a practical use area where the output power is relatively small, since influence of the gate drive loss PGATE in the above-described equation (2) is large, reduction of the transistor size allows the reduction of the power loss, and is effective as a measure against heat generation.

However, when the output power becomes large, since the conduction loss PCOND in the equation (1) is proportional to a square of the current, the power loss becomes larger as the transistor size is smaller. During circuit design, since maximum output power needs to be taken into consideration, a circuit is configured by adopting the transistors M1-M4 of the sufficiently large transistor size. That is, in the related technology in FIG. 2, there is a problem that, when the maximum output power is taken into consideration, the loss in the practical use area cannot be sufficiently reduced and it is disadvantageous in terms of heat generation or the like.

FIG. 5 illustrates power efficiency in the case that the transistor size is relatively small with a solid line (Small), and illustrates the power efficiency in the case that the transistor size is relatively large with a broken line (Large). It is recognized that, when the maximum output power is taken into consideration and the circuit is configured by adopting the transistors M1-M4 of the large transistor size, the efficiency is deteriorated due to influence by the gate drive loss PGATE in the practical use area where the output power is relatively small.

In this way, since the output transistors M1-M4 are designed in the relatively large transistor size in order to suppress the conduction loss at the maximum output power, an output element of an excessive size is driven and the excess gate drive loss PGATE is generated during the practical use. In addition, when the switching frequency FSW of the transistors M1-M4 becomes high, as illustrated in the above-described equation (2), the gate drive loss PGATE increases so that the power loss in the practical use area further increases. In particular, because of a demand for audio high resolution in recent years, sampling frequency becomes high, the switching frequency of the output transistor also tends to be turned high, and efficiency deterioration due to increase of the gate drive loss PGATE is a further noticeable problem.

Therefore, in the present embodiment, in order to suppress the power loss regardless of the input/output level, by dynamically changing the transistor size to make the transistor size relatively small in the case that the input/output level is relatively low and to make the transistor size relatively large in the case that the input/output level is relatively high, the power loss is reduced and the efficiency is improved.

In FIG. 1, same signs are attached to same components as the components in the related technology in FIG. 2. In an example in FIG. 1, each of the respective transistors M1-M4 of a bridge configuration in FIG. 2 is constituted of two output transistors M1A and M1B-M4A and M4B connected in parallel respectively, and whether to operate one or to operate both of the two transistors M1A and M1B-M4A and M4B connected in parallel is switched based on the control signal.

For example, when it is assumed that the transistor size (gate width) of the transistors M1-M4 corresponds to Large in FIG. 4, the transistor size (gate width) of the transistors M1A-M4A (also referred to as a first transistor group MA, hereinafter) is set to the size corresponding to Small in FIG. 4. In addition, transistors for which a sum of the gate widths of the transistors M1A and M1B, the sum of the gate widths of the transistors M2A and M2B, the sum of the gate widths of the transistors M3A and M3B and the sum of the gate widths of the transistors M4A and M4B respectively coincide with the gate width of the transistors M1-M4 are adopted as the transistors M1B-M4B (also referred to as a second transistor group MB, hereinafter). Thus, the character illustrated by Small in FIG. 4 can be obtained in the case of operating only the first transistor group MA, and the characteristic illustrated by Large in FIG. 4 can be obtained in the case of operating all of the first transistor group MA and the second transistor group MB.

The configurations of the inversion circuit 11, the carrier generation circuit 12, the comparators 13p and 13n, and the dead time generation circuits 14p and 14n in FIG. 1 are similar to the configurations of the inversion circuit 11, the carrier generation circuit 12, the comparators 13p and 13n, and the dead time generation circuits 14p and 14n in FIG. 2, respectively. The comparator 13p outputs the positive phase PWM pulse based on the sound input to the dead time generation circuit 14p, and the comparator 13n outputs the negative phase PWM pulse based on the sound input to the dead time generation circuit 14n.

The dead time generation circuit 14p provides the dead time in the positive phase PWM pulse, outputs the positive phase high side PWM pulse from the OUT_H terminal, and outputs the positive phase low side PWM pulse from the OUT_L terminal. Similarly, the dead time generation circuit 14n provides the dead time in the negative phase PWM pulse, outputs the negative phase high side PWM pulse from the OUT_H terminal, and outputs the negative phase low side PWM pulse from the OUT_L terminal.

In the present embodiment, the low side PWM pulse from the dead time generation circuit 14p is supplied through a gate driver 16pLA to the gate of the transistor M3A, and is also supplied to an IN2 terminal of a selector 19pL. In addition, the low side PWM pulse from the dead time generation circuit 14n is supplied through a gate driver 16nLA to the gate of the transistor M1A, and is also supplied to an IN2 terminal of a selector 19nL.

To IN1 terminals of the selectors 19pL and 19nL, the control signal from a control circuit 20 is also supplied. The control circuit 20 sets an operation mode (referred to as a small mode, hereinafter) of operating only the first transistor group MA or sets an operation mode (referred to as a large mode, hereinafter) of operating all of the first and second transistor groups MA and MB. The control circuit 20 outputs the control signal of a low level (referred to as an L level, hereinafter) for example in the case of setting the small mode, and outputs the control signal of a high level (referred to as an H level, hereinafter) for example in the case of setting the large mode.

The selectors 19pL and 19nL respectively output the PWM pulse inputted to the IN2 terminal from an OUT terminal to a gate driver 16pLB or 16nLB, only in the case that the control signal of the H level is inputted to the IN1 terminal. Therefore, for the low side, only the gate drivers 16pLA and 16nLA are operated in the case that the control signal is the L level, and all of the gate drivers 16pLA, 16pLB, 16nLA and 16nLB are operated in the case that the control signal is the H level. The gate drivers 16pLA, 16pLB, 16nLA and 16nLB apply the signals based on the inputted PWM pulse to the gates of the transistors M3A, M3B, MIA and M1B respectively.

In this way, the gate driver 16pLA drives the transistor M3A based on the positive phase PWM pulse at all times, and the gate driver 16nLA drives the transistor M1A based on the negative phase PWM pulse at all times. On the other hand, the gate driver 16pLB drives the transistor M3B based on the positive phase PWM pulse only in the case that the control signal is the H level, and the gate driver 16nLB drives the transistor M1B based on the negative phase PWM pulse only in the case that the control signal is the H level.

Also for the high side, similarly to the low side, gate drivers 16pHA, 16pHB, 16nHA, and 16nHB to supply the PWM pulse are controlled based on the control signal. For the high side, since respective elements on the high side need to be driven with the positive phase PWM output PWM+ at the positive phase output end as a reference, the level is shifted not only for the PWM pulse but also for the control signal.

That is, in a level shift circuit 18p, the positive phase high side PWM pulse from the dead time generation circuit 14p is supplied to an IN_A terminal, and the control signal from the control circuit 20 is supplied to an IN_B terminal. The level shift circuit 18p shifts the level of the positive phase high side PWM pulse to the predetermined level, then supplies the positive phase high side PWM pulse from an OUT_A terminal through a gate driver 16pHA to the gate of the transistor M4A, and also supplies the positive phase high side PWM pulse to an IN2 terminal of a selector 19pH. In addition, the level shift circuit 18p shifts the level of the control signal to the predetermined level, and then supplies the control signal from an OUT_B terminal to an IN1 terminal of the selector 19pH.

Furthermore, in a level shift circuit 18n, the negative phase high side PWM pulse from the dead time generation circuit 14n is supplied to an IN_A terminal, and the control signal from the control circuit 20 is supplied to an IN_B terminal. The level shift circuit 18n shifts the level of the negative phase high side PWM pulse to the predetermined level, then supplies the negative phase high side PWM pulse from an OUT_A terminal through a gate driver 16nHA to the gate of the transistor M2A, and also supplies the negative phase high side PWM pulse to an IN2 terminal of a selector 19nH. In addition, the level shift circuit 18n shifts the level of the control signal to the predetermined level, and then supplies the control signal from an OUT_B terminal to an IN1 terminal of the selector 19nH.

The selectors 19pH and 19nH respectively output the PWM pulse inputted to the IN2 terminal from the OUT terminal to a gate driver 16pHB or 16nHB, only in the case that the control signal of the H level is inputted to the IN1 terminal. Therefore, for the high side, only the gate drivers 16pHA and 16nHA are operated in the case that the control signal is the L level, and all of the gate drivers 16pHA, 16pHB, 16nHA and 16nHB are operated in the case that the control signal is the H level. Note that the level shift circuit 18p may be arranged in a subsequent stage of the selector 19pH, and the level shift circuit 18n may be arranged in a subsequent stage of the selector 19nH.

The gate drivers 16pHA, 16pHB, 16nHA and 16nHB apply the signals based on the inputted PWM pulse to the gates of the transistors M4A, M4B, M2A and M2B respectively. In this way, the gate driver 16pHA drives the transistor M4A based on the positive phase PWM pulse at all times, and the gate driver 16nHA drives the transistor M2A based on the negative phase PWM pulse at all times. On the other hand, the gate driver 16pHB drives the transistor M4B based on the positive phase PWM pulse only in the case that the control signal is the H level, and the gate driver 16nHB drives the transistor M2B based on the negative phase PWM pulse only in the case that the control signal is the H level.

Between the power source and the reference potential point, a drain/source path of the transistor M4A and a drain/source path of the transistor M3A that are connected in series and a drain/source path of the transistor M4B and a drain/source path of the transistor M3B that are connected in series are connected in parallel. A connection point of a source of the transistor M4A and a drain of the transistor M3A and a connection point of a source of the transistor M4B and a drain of the transistor M3B are connected to each other.

In addition, between the power source and the reference potential point, a drain/source path of the transistor M2A and a drain/source path of the transistor M1A that are connected in series and a drain/source path of the transistor M2B and a drain/source path of the transistor M1B that are connected in series are connected in parallel. A connection point of a source of the transistor M2A and a drain of the transistor M1A and a connection point of a source of the transistor M2B and a drain of the transistor M1B are connected to each other.

The power amplification portion is constituted of the circuit part from the dead time generation circuits 14p and 14n to the transistors M1A-M4A and M1B-M4B, and the class-D amplifier portion is constituted of the PWM modulator and the power amplification portion. The connection point of the source of the transistors M4A and M4B and the drain of the transistors M3A and M3B is the positive phase output end of the class-D amplifier portion, and the connection point of the source of the transistors M2A and M2B and the drain of the transistors M1A and M1B is the negative phase output end of the class-D amplifier portion.

The configurations of the coil Lp and capacitor Cp and the coil Ln and the capacitor Cn configuring the low-pass filters connected to the positive phase output end and the negative phase output end, the capacitor Cout and the speaker 17 are similar to the configurations in FIG. 2. Note that the class-D amplifier portion is often made into an IC, and in this case, the coils Lp and Ln and the capacitors Cp, Cn and Cout are connected as external components.

The control circuit 20 can generate the control signal for switching the small mode and the large mode depending on whether or not it is a mute state of stopping sound output, for example. In addition, the control circuit 20 can generate the control signal for switching the small mode and the large mode based on the sound input, the PWM output PWM+ appearing at the positive phase output end or the PWM output PWM− appearing at the negative phase output end, for example. The control circuit 20 may set the small mode in the case that the level of the sound input is lower than a threshold and set the large mode in the case that the level of the sound input is higher, by being supplied with the sound input for example and comparing the sound input with the threshold stored in a memory not illustrated. In addition, the control circuit 20 may set the small mode in the case that a PWM output level is lower than the threshold and set the large mode in the case that the PWM output level is higher, by comparing the positive phase or negative phase PWM output with the threshold stored in the memory not illustrated. For example, by setting an upper limit value of the practical use area as the threshold of the sound input or the PWM output, the control circuit 20 may set the small mode in the practical use area and set the large mode in a range of the output level exceeding the practical use area determined by the threshold.

Note that, ideally, the control circuit 20 may perform control so as to set the small mode in the range of the output power equal to or lower than the power (referred to as loss matching power, hereinafter) at an intersection of the characteristic of the solid line and the characteristic of the broken line in FIG. 4, and set the large mode in the output power range exceeding the loss matching power. By obtaining the characteristic in FIG. 4 during the design, the loss matching power can be recognized, the input or the output level at which the loss matching power can be obtained can be also estimated to a certain degree, and an estimated value may be set as the threshold.

Figure 6:
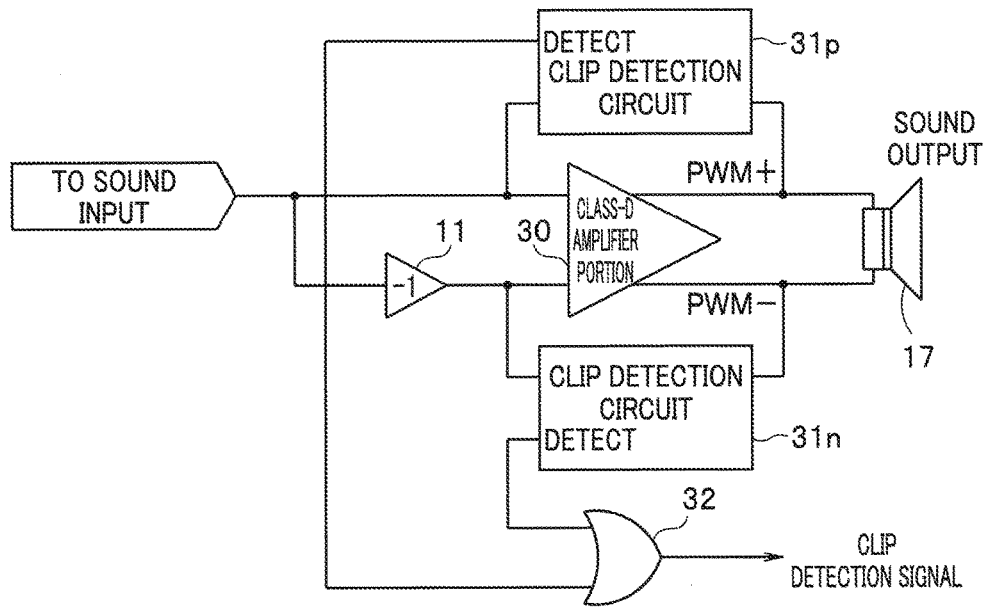
FIG. 6 is a block diagram illustrating one example of a control circuit 20 in FIG. 1.

FIG. 6 is a block diagram illustrating an example of the control circuit 20 in FIG. 1. During actual use, the input/output level corresponding to the loss matching power cannot be obtained sometimes. Therefore, the example in FIG. 6 is the example of switching the small mode and the large mode depending on whether or not it is a clip period to be described later. In FIG. 6, the control circuit 20 in FIG. 1 is constituted of clip detection circuits 31p and 31n and an OR circuit 32. A class-D amplifier portion 30 in FIG. 6 corresponds to the circuit part excluding the inversion circuit 11, the speaker 17 and the control circuit 20 from the class-D amplifier portion in FIG. 1. In addition, in FIG. 6, illustrations of the low-pass filters and the capacitor connected to the positive phase and negative phase output ends are omitted.

To the clip detection circuit 31p, the sound input and the signal appearing at the positive phase output end of the class-D amplifier portion 30 are given. In addition, to the clip detection circuit 31n, the inverted sound input and the signal appearing at the negative phase output end of the class-D amplifier portion 30 are given.

Figure 7:
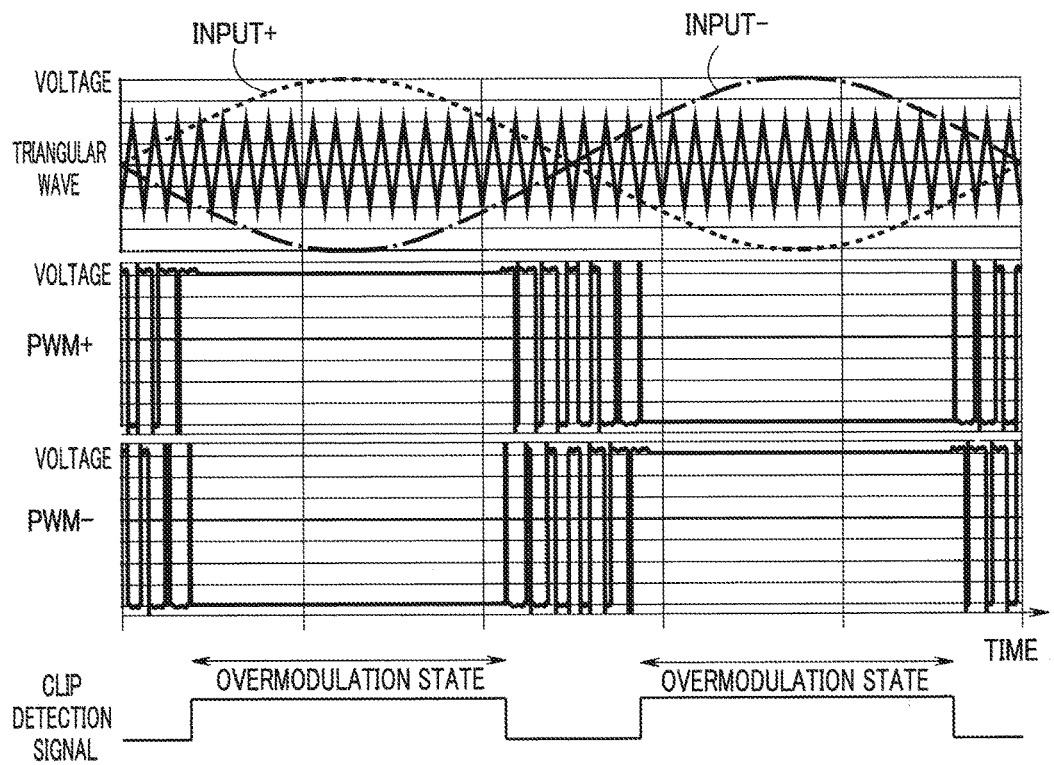
FIG. 7 is an explanatory drawing illustrating a relation between sound input and the PWM output PWM+ and PWM− and a control signal in an overmodulation state.

FIG. 7 is an explanatory drawing illustrating a relation between the sound input and the PWM output PWM+ and PWM− and the control signal in an overmodulation state. In the practical use area, as illustrated in FIG. 3, the design is performed such that the level of the sound input becomes low in contrast with the level of the triangular wave that is the carrier. Thus, for the PWM pulse from the comparators 13p and 13n, even though a duty ratio changes, a frequency is fixed. However, sometimes the overmodulation state in which the level of the sound input becomes high in contrast with the level of the triangular wave occurs. Then, the PWM pulse is fixed at a predetermined high level or low level, and the output transistors M1A-M4A and M1B-M4B are turned to a non-switching state. In this case, as illustrated in FIG. 7, the PWM output PWM+ and the PWM− are fixed to the power source or ground level (referred to as a clip level, hereinafter).

When it is assumed that the sound input is a sine waveform, in the overmodulation state, the PWM output is fixed at the clip level; however, the output power increases until an output waveform becomes a rectangular wave. In the case of using the relatively small transistor size as the output transistors M1-M4 in FIG. 2, the conduction loss PCOND in the above-described equation (1) is larger than the gate drive loss PGATE in the above-described equation (2) in the overmodulation state, and as illustrated in FIG. 4, the power loss increases together with the increase of the output power. In contrast, in the case of using the relatively large transistor size as the output transistors M1-M4, the gate drive loss PGATE in the above-described equation (2) is larger than the conduction loss PCOND in the above-described equation (1) in the overmodulation state. In the overmodulation state, since the output transistors M1-M4 do not perform switching, the power loss decreases together with the increase of the output power. That is, in the case that the transistor size is large, the power loss decreases from a peak value after timing at which the output level is fixed at the clip level.

Therefore, a period (referred to as a clip period, hereinafter) during which it is in the overmodulation state and the PWM output is fixed at the clip level is the period during which the output power equal to or more than the power to be the maximum characteristic illustrated by the broken line in FIG. 4 is obtained, and the loss can be reduced when the transistor size is made larger as the output transistors.

The clip detection circuits 31p and 31n output a clip detection signal of the H level indicating that it is the clip period only in the case that the sound input is at or above the input level to be in the overmodulation state. In addition, the clip detection circuits 31p and 31n may output the clip detection signal of the H level indicating that it is the clip period only in the case of detecting that the PWM output is clipped, that is, switching is not performed. The clip detection signal from the clip detection circuits 31p and 31n is supplied to the OR circuit 32, ORed, and outputted as the control signal. As illustrated in FIG. 7, the OR circuit 32 outputs the clip detection signal to be the H level in the case of the overmodulation state and to be the L level otherwise as the control signal.

Note that the clip detection circuits 31p and 31n may output the clip detection signal of the H level in the case that the clip level is maintained continuously for a predetermined period.

Figure 8:
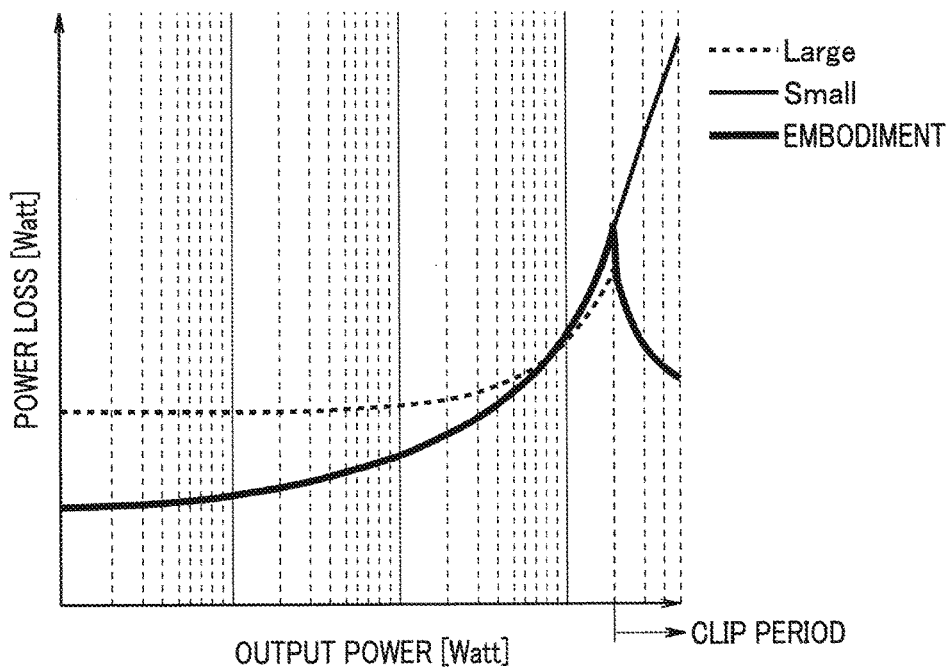
FIG. 8 is a graph representing the output power on the horizontal axis, representing the power loss on the vertical axis and illustrating a same characteristic as FIG. 4 for the relation between the transistor size and the loss.
Figure 9:
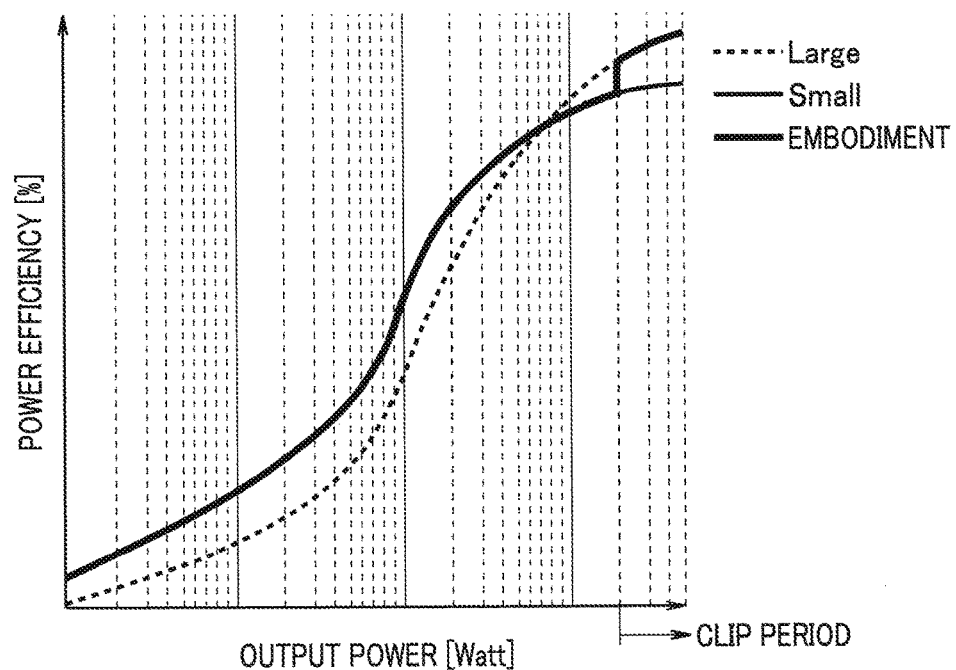
FIG. 9 is a graph representing the output power on the horizontal axis, representing the efficiency on the vertical axis and illustrating the same characteristic as FIG. 5 for the relation between the transistor size and the efficiency.

Next, an operation of the embodiment configured in this way will be described with reference to FIG. 8 and FIG. 9. FIG. 8 is a graph representing the output power on the horizontal axis, representing the output loss on the vertical axis and illustrating the same characteristic as FIG. 4 for the relation between the transistor size and the loss, and FIG. 9 is a graph representing the output power on the horizontal axis, representing the efficiency on the vertical axis and illustrating the same characteristic as FIG. 5 for the relation between the transistor size and the efficiency.

An example of the case of adopting the clip detection circuits 31p and 31n in FIG. 6 as the control circuit 20 will be described. Now, it is assumed that the voice input is not in the overmodulation state. In this case, the clip detection circuits 31p and 31n detect that the input level of the sound input and the PWM output are not clipped or the like and output the clip detection signal of the L level. The OR circuit 32 outputs the clip detection signal of the L level as the control signal.

The sound input is given to the comparator 13p, and is also inverted by the inversion circuit 11 and then given to the comparator 13n. The comparators 13p and 13n output the positive phase PWM pulse and the negative phase PWM pulse respectively by comparison between the triangular wave carrier and the inputted sound signal.

The dead time generation circuit 14p adds the dead time to the positive phase PWM pulse, and outputs the low side and high side PWM pulses. In addition, the dead time generation circuit 14n adds the dead time to the negative phase PWM pulse, and outputs the low side and high side PWM pulses.

The positive phase low side PWM pulse from the dead time generation circuit 14p is supplied to the gate driver 16pLA and the IN2 terminal of the selector 19pL. In addition, the positive phase high side PWM pulse from the dead time generation circuit 14p is shifted to the predetermined level by the level shift circuit 18p, and then supplied to the gate driver 16pHA and the IN2 terminal of the selector 19pH.

The negative phase low side PWM pulse from the dead time generation circuit 14n is supplied to the gate driver 16nLA and the IN2 terminal of the selector 19nL. In addition, the negative phase high side PWM pulse from the dead time generation circuit 14n is shifted to the predetermined level by the level shift circuit 18n, and then supplied to the gate driver 16nHA and the IN2 terminal of the selector 19nH.

When it is not in the overmodulation state, since the control signal is the L level, none of the selectors 19pH, 19pL, 19nH and 19nL outputs the input of the IN2 terminal. Therefore, in this case, only the gate drivers 16pHA, 16pLA, 16nHA and 16nLA are operated, the transistor M4A is driven by the positive phase high side PWM pulse, the transistor M3A is driven by the positive phase low side PWM pulse, the transistor M2A is driven by the negative phase high side PWM pulse, and the transistor M1A is driven by the negative phase low side PWM pulse. Thus, the positive phase PWM pulse is amplified and the PWM output PWM+ appears at the positive phase output end, and the negative phase PWM pulse is amplified and the PWM output PWM− appears at the negative phase output end.

In the case that the positive phase PWM pulse is at or above the predetermined level, the transistors M4A and M1A are turned on, and the current flows from the positive phase output end through the speaker 17 to the negative phase output end. In addition, in the case that the positive phase PWM pulse is below the predetermined level, the transistors M2A and M3A are turned on, and the current flows from the negative phase output end through the speaker 17 to the positive phase output end. The carrier component is removed by the low-pass filter from the positive phase PWM output PWM+ and the negative phase PWM output PWM−, and the speaker 17 is driven by the sound signal appearing at both ends of the capacitor Cout. The speaker 17 outputs the sound signal based on the sound input signal.

When it is not in the overmodulation state, since only the first transistor group MA is operated, in the case of configuring the transistors M1A-M4A by the transistor size corresponding to the solid line FIG. 4, the characteristic illustrated by the solid line in FIG. 4 is obtained. In FIG. 8, the characteristic is illustrated by a thick line.

Next, it is assumed that the level of the sound input rises and it is in the overmodulation state. Then, the PWM pulse from the comparators 13p and 13n is clipped at the predetermined level, and as a result, the switching of the first transistor group MA is stopped. Thus, the clip period during which the PWM output is at the clip level is attained.

The clip detection circuits 31p and 31n detect that the input level of the sound input and the PWM output are clipped or the like and output the clip detection signal of the H level. The OR circuit 32 outputs the clip detection signal of the H level as the control signal. Then, the selectors 19pH, 19pL, 19nH and 19nL output the input of the IN2 terminal from the OUT terminal to the gate drivers 16pHB, 16pLB, 16nHB and 16nLB respectively. Therefore, in this case, not only the gate drivers 16pHA, 16pLA, 16nHA and 16nLA but also the gate drivers 16pHB, 16pLB, 16nHB and 16nLB are operated.

That is, in this case, the transistors M4A and M4B are driven by the positive phase high side PWM pulse, the transistors M3A and M3B are driven by the positive phase low side PWM pulse, the transistors M2A and M2B are driven by the negative phase high side PWM pulse, and the transistors M1A and M1B are driven by the negative phase low side PWM pulse. Thus, at the positive phase output end, by the transistors M4A and M4B for the high side and the transistors M3A and M3B for the low side, the positive phase PWM pulse is amplified and the PWM output PWM+ appears. In addition, at the negative phase output end, by the transistors M2A and M2B for the high side and the transistors M1A and M1B for the low side, the negative phase PWM pulse is amplified and the PWM output PWM− appears.

The transistors M4A and M4B to the transistors M1A and M1B are respectively connected in parallel and operated, and it is equivalent to obtaining the PWM output by the transistor of the sum of the gate widths of the transistors M4A and M4B, the transistor of the sum of the gate widths of the transistors M3A and M3B, the transistor of the sum of the gate widths of the transistors M2A and M2B, and the transistor of the sum of the gate widths of the transistors M1A and M1B. Therefore, in the case of configuring the transistor by a combination of the transistors M4A and M4B to the transistors M1A and M1B by the transistor size corresponding to the broken line in FIG. 4, the characteristic illustrated by the broken line in FIG. 4 is obtained in the clip period. In FIG. 8, the characteristic is illustrated by the thick line.

As illustrated by the thick line in FIG. 8, in the most of the practical use area and the clip period, the class-D amplifier in the present embodiment is operated with the relatively small loss. In addition, as illustrated by the thick line in FIG. 9, in the most of the practical use area and the clip period, the class-D amplifier in the present embodiment is operated with the relatively high efficiency.

In this way, in the present embodiment, the amplification with the small loss is possible by the output transistor of the relatively small transistor size in the practical use area where the output power is relatively low, and the amplification with suppressed loss increase is possible by the output transistor of the relatively large transistor size in an area where the output power is relatively high as in the overmodulation state or the like. That is, in the present embodiment, in the respective areas from the practical use area to a use area corresponding to the maximum output voltage for the level of the sound input, the conduction loss and the gate drive loss of the output transistor are suppressed, and drive with the low loss and the high efficiency is possible. Thus, even in the case that the switching frequency of the output transistor is relatively high, the increase of the gate drive loss is suppressed, and the drive with the high efficiency is made possible.

Note that, in the embodiment described above, by driving one of the respective two first transistor group MA and second transistor group MB in the small mode and driving both in the large mode, the transistor size is switched. Further, the respective transistors of the first transistor group MA may be constituted of the transistor size for the small mode, the respective transistors of the second transistor group MB may be constituted of the transistor size for the large mode, and the transistor group may be switched and driven for the small mode and the large mode.

Second Embodiment

Figure 10:
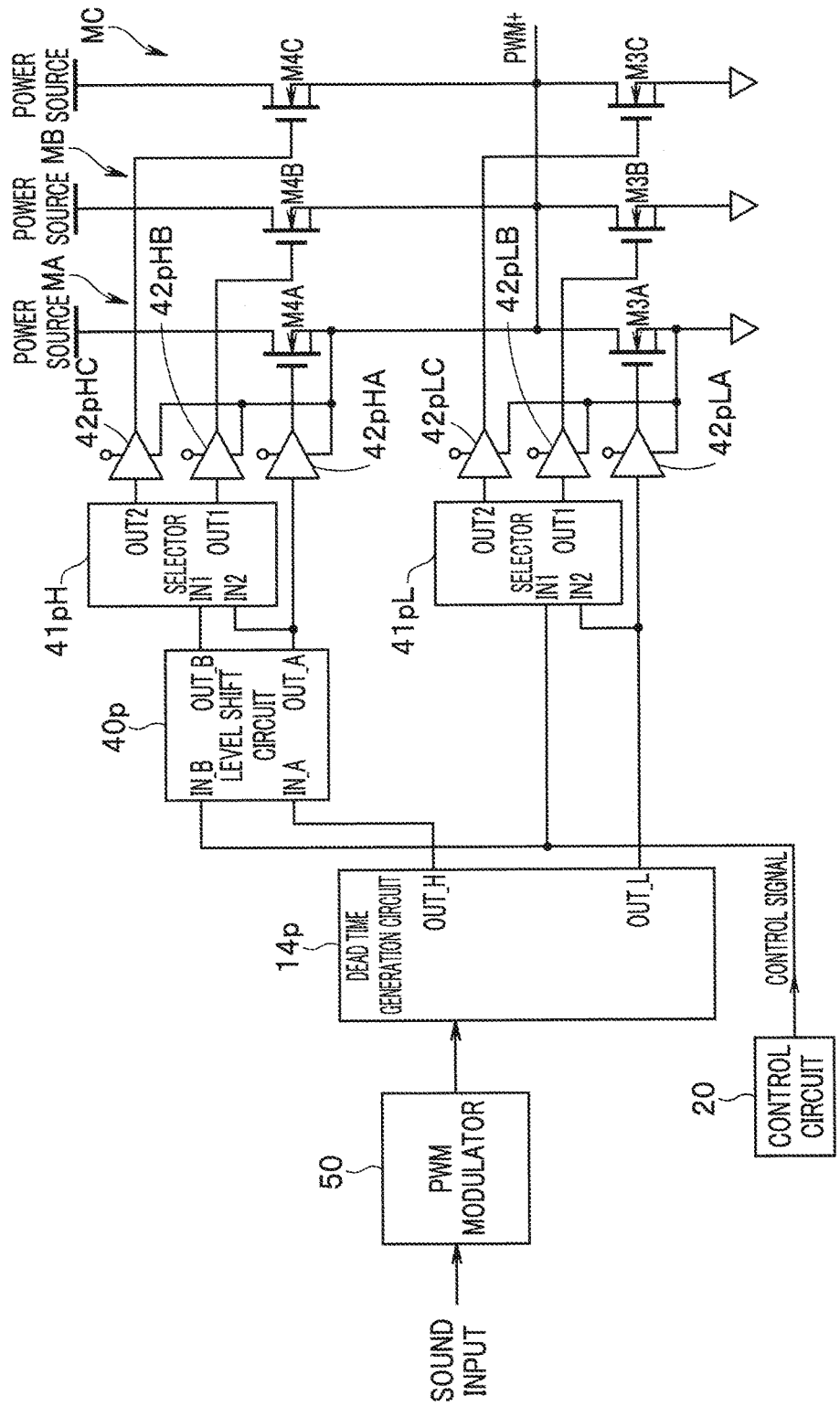
FIG. 10 is a circuit diagram illustrating a second embodiment of the present invention.

FIG. 10 is a circuit diagram illustrating the second embodiment of the present invention. In FIG. 10, for simplification of the drawing, the inversion circuit 11, the carrier generation circuit 12 and the two comparators 13$p$ and 13$n$ in FIG. 1 are illustrated by a PWM modulator 50, and for the subsequent stage of the PWM modulator 50, only the configuration on a positive phase side is illustrated. Note that the configuration on a negative phase side after the dead time generation circuit 14$n$ is similar to the configuration on the positive phase side after the dead time generation circuit 14$p$, and the illustrations and description are omitted.

In the first embodiment, by using the two transistors in parallel respectively for the four output transistors for the positive phase high side and low side and for the negative phase high side and low side, the characteristic similar to the characteristic in the case of changing the transistor size in two ways is obtained. In contrast, in the present embodiment, by using the three transistors in parallel respectively for the four output transistors for the positive phase high side and low side and for the negative phase high side and low side, the characteristic similar to the characteristic in the case of changing the transistor size in three ways is obtained.

Between the power source and the reference potential point, the drain/source path of the transistor M4A and the drain/source path of the transistor M3A connected in series, the drain/source path of the transistor M4B and the drain/source path of the transistor M3B connected in series, and the drain/source path of the transistor M4C and the drain/source path of the transistor M3C connected in series are connected in parallel. The connection point of the source of the transistor M4A and the drain of the transistor M3A, the connection point of the source of the transistor M4B and the drain of the transistor M3B, and the connection point of the source of the transistor M4C and the drain of the transistor M3C are connected to each other. The connection point is the positive phase output end of the class-D amplifier portion.

Note that, though not illustrated in FIG. 10, the output transistors M2A-M2C and M1A-M1C of the same configuration as the configuration of the output transistors M4A-M4C and M3A-M3C are provided also on the negative phase side. On the negative phase side, the connection point of the source of the transistor M2A and the drain of the transistor M1A, the connection point of the source of the transistor M2B and the drain of the transistor M1B, and the connection point of the source of the transistor M2C and the drain of the transistor M1C are connected to each other, and the connection point is the negative phase output end of the class-D amplifier portion.

The dead time generation circuit 14$p$ provides the dead time in the positive phase PWM pulse, and outputs the positive phase high side PWM pulse and low side PWM pulse. The low side PWM pulse from the dead time generation circuit 14$p$ is supplied through a gate driver 42$p$LA to the gate of the transistor M3A, and is also supplied to the IN2 terminal of a selector 41$p$L. To the IN terminal of the selector 41$p$L, the control signal from the control circuit 20 is supplied.

In addition, the dead time generation circuit 14$p$ provides the dead time in the positive phase PWM pulse, and supplies the positive phase high side PWM pulse to the IN_A terminal of a level shift circuit 40$p$. To the IN_B terminal of the level shift circuit 40$p$, the control signal from the control circuit 20 is supplied.

The level shift circuit 40$p$ shifts the positive phase high side PWM pulse to the predetermined level, then supplies the positive phase high side PWM pulse from the OUT_A terminal through a gate driver 42$p$HA to the gate of the transistor M4A, and also supplies the positive phase high side PWM pulse to the IN2 terminal of a selector 41$p$H. In addition, the level shift circuit 40$p$ shifts the level of the control signal to the predetermined level, and then supplies the control signal from the OUT_B terminal to the IN1 terminal of the selector 41$p$H.

The control circuit 20 sets an operation mode (referred to as a minimum mode, hereinafter) of operating only the transistors M1A-M4A (referred to as the first transistor group MA, hereinafter), sets an operation mode (referred to as an intermediate mode, hereinafter) of operating the first transistor group MA and the transistors M1B-M4B (referred to as the second transistor group MB, hereinafter), or sets an operation mode (referred to as a maximum mode, hereinafter) of operating the first transistor group MA, the second transistor group MB and the transistors M1C-M4C (referred to as a third transistor group MC, hereinafter). The control circuit 20 outputs the control signal for setting the minimum mode, the intermediate mode and the maximum mode.

The selectors 41$p$H and 41$p$L do not output the PWM pulse from an OUT1 terminal and an OUT2 terminal in the case that the control signal specifying the minimum mode is inputted to the IN1 terminal, output the PWM pulse inputted to the IN2 terminal from the OUT1 terminal in the case that the control signal specifying the intermediate mode is inputted to the IN1 terminal, and output the PWM pulse inputted to the IN2 terminal from the OUT1 terminal and the OUT2 terminal in the case that the control signal specifying the maximum mode is inputted to the IN1 terminal. The PWM pulse from the OUT1 terminal of the selector 41$p$H is given to a gate driver 42$p$HB, and the PWM pulse from the OUT2 terminal is given to a gate driver 42$p$HC. The PWM pulse from the OUT1 terminal of the selector 41$p$L is given to a gate driver 42$p$LB, and the PWM pulse from the OUT2 terminal is given to a gate driver 42$p$LC.

Therefore, for the positive phase side, only the gate drivers 42$p$HA and 42$p$LA are operated in the case that the control signal specifies the minimum mode, the gate drivers 42$p$HA, 42$p$HB, 42$p$LA, and 42$p$LB are operated in the case that the control signal specifies the intermediate mode, and all the gate drivers 42$p$HA, 42$p$HB, 42$p$HC, 42$p$LA, 42$p$LB, and 42$p$LC are operated in the case that the control signal specifies the maximum mode. The gate drivers 42$p$HA- 42*p*HC and 42*p*LA-42*p*LC impress the signal based on the inputted PWM pulse to the gates of the transistors M4A-M4C and M3A-M3C respectively.

The configuration on the negative phase side is similar to the configuration on the positive phase side.

Figure 11:
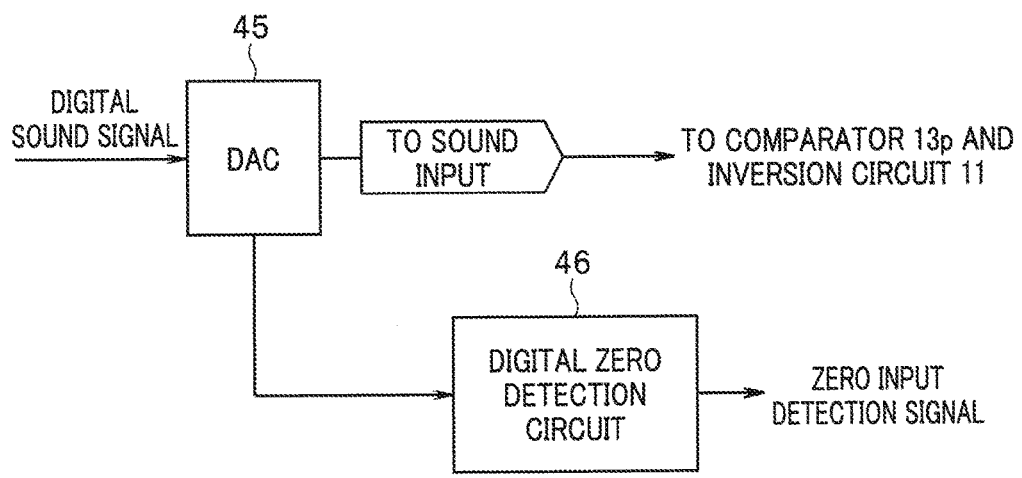
FIG. 11 is a block diagram illustrating one example of a specific configuration of the control circuit 20 adopted in the second embodiment.

Next, the operation of the embodiment configured in this way will be described with reference to FIG. 11 to FIG. 14. FIG. 11 is a block diagram illustrating one example of a specific configuration of the control circuit 20 adopted in the second embodiment. Note that the operation on the negative phase side is similar to the operation on the positive phase side so that the description is omitted.

(Corresponding to Non-Input Time)

The control circuit 20 in the present embodiment generates the control signals of two bits for example for specifying the minimum mode, the intermediate mode and the maximum mode. For example, as the control circuit 20, it is assumed that the clip detection circuits 31*p* and 31*n* in FIG. 6 are adopted, and a digital zero detection circuit 46 illustrated in FIG. 11 is adopted. In this case, the intermediate mode and the maximum mode correspond to the small mode and the large mode in the first embodiment, and the minimum mode corresponds to non-input time.

In FIG. 11, a digital sound signal is inputted to a digital/analog converter (DAC) 45. The DAC 45 converts the inputted digital sound signal to an analog signal, and outputs the analog signal to the comparator 13*p* and the inversion circuit 11 (see FIG. 1). The output of the DAC 45 is also given to the digital zero detection circuit 46. The digital zero detection circuit 46 detects a non-input state from the output of the DAC 45. For example, the digital zero detection circuit 46 determines that it is in the non-input state and outputs a zero input detection signal in the case that the output of the DAC 45 is 0 data continuously for the predetermined period.

The clip detection signal from the OR circuit 32 in FIG. 6 and the zero input detection signal from the digital zero detection circuit 46 are given to the level shift circuit 40*p* and the selectors 41*p*H and 41*p*L as the control signal. Note that, in this case, the minimum mode is set by the zero input detection signal indicating the non-input state, the intermediate mode is set by the clip detection signal indicating the sound input that is not in the non-input state or the overmodulation state, and the maximum mode is set by the clip detection signal indicating the sound input of the overmodulation state.

In this example, it is assumed that the respective transistor sizes (gate widths) of the first transistor group MA, the second transistor group MB and the third transistor group MC are set such that the characteristic of the solid line in FIG. 4 is obtained in the case of operating the first transistor group MA and the second transistor group MB and the characteristic of the broken line in FIG. 4 is obtained in the case of operating the first transistor group MA, the second transistor group MB and the third transistor group MC.

In this example, when it is not in the non-input state, the operation similar to the operation in the first embodiment is performed. That is, for the sound input corresponding to a period excluding the clip period, by the zero input detection signal and the clip detection signal, the selectors 41*p*H and 41*p*L output the inputted PWM pulse from the OUT1 terminal to the gate drivers 42*p*HB and 42*p*LB respectively. Thus, the first transistor group MA and the second transistor group MB are operated and the characteristic of the solid line in FIG. 4 is obtained.

In addition, for the sound input corresponding to the clip period, by the zero input detection signal and the clip detection signal, the selectors 41*p*H and 41*p*L output the inputted PWM pulse from the OUT1 terminal to the gate drivers 42*p*HB and 42*p*LB respectively, and also output the inputted PWM pulse from the OUT2 terminal to the gate drivers 42*p*HC and 42*p*LC respectively. Thus, the first transistor group MA, the second transistor group MB and the third transistor group MC are operated and the characteristic of the broken line in FIG. 4 is obtained.

Here, it is assumed that it is in the non-input state in which the sound input is not inputted. When detecting the non-input state from the output of the DAC 45, the digital zero detection circuit 46 outputs the zero input detection signal indicating that it is in the non-input state. Thus, the selectors 41*p*H and 41*p*L do not output the inputted PWM pulse. Thus, only the first transistor group MA is operated. Therefore, the loss during non-input can be further reduced.

(In the Case of Optimization)

Figure 12:
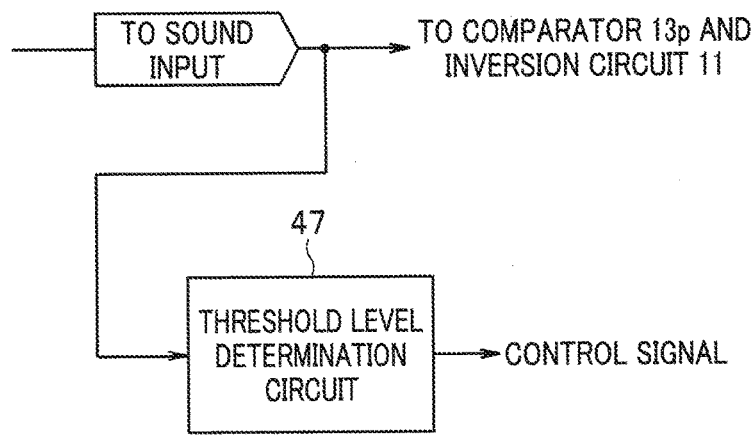
FIG. 12 is a block diagram illustrating another specific configuration example of the control circuit 20 adopted in the second embodiment.
Figure 13:
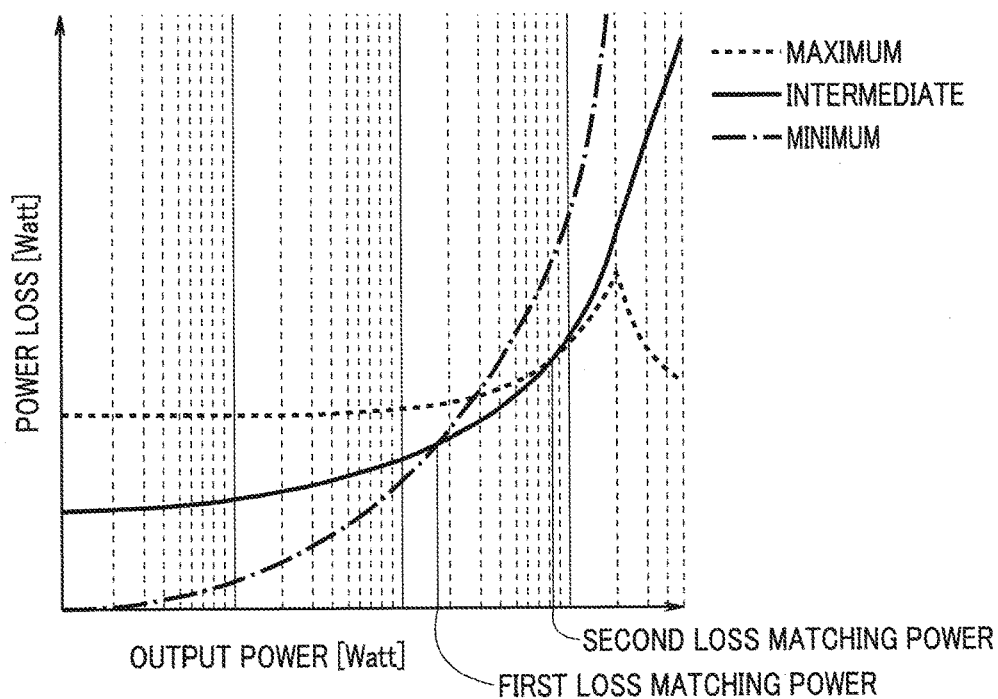
FIG. 13 is a graph representing the output power on the horizontal axis, representing the output loss on the vertical axis and illustrating the relation between the transistor size and the loss.
Figure 14:
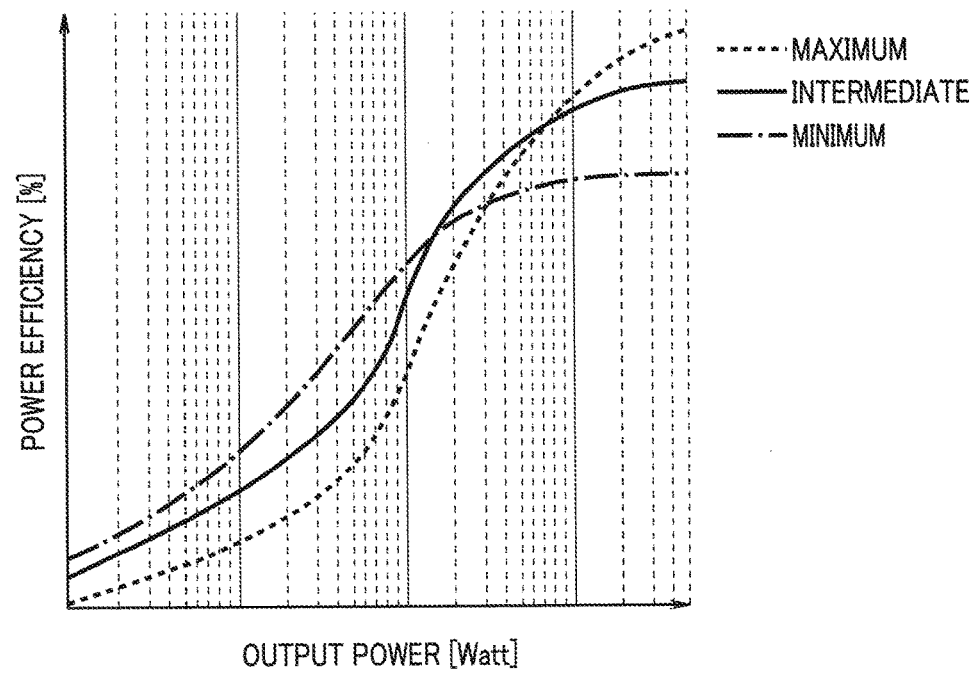
FIG. 14 is a graph representing the output power on the horizontal axis, representing the efficiency on the vertical axis and illustrating the relation between the transistor size and the efficiency.
Figure 15:
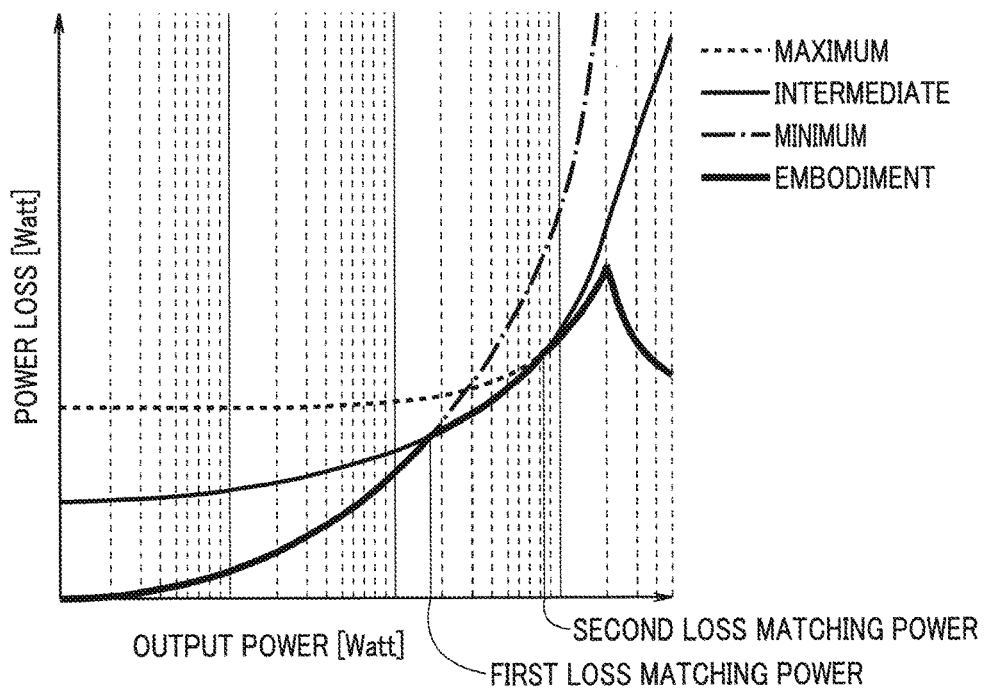
FIG. 15 is a graph illustrating the characteristic in FIG. 13 and illustrating the characteristic of the present embodiment by a thick line.
Figure 16:
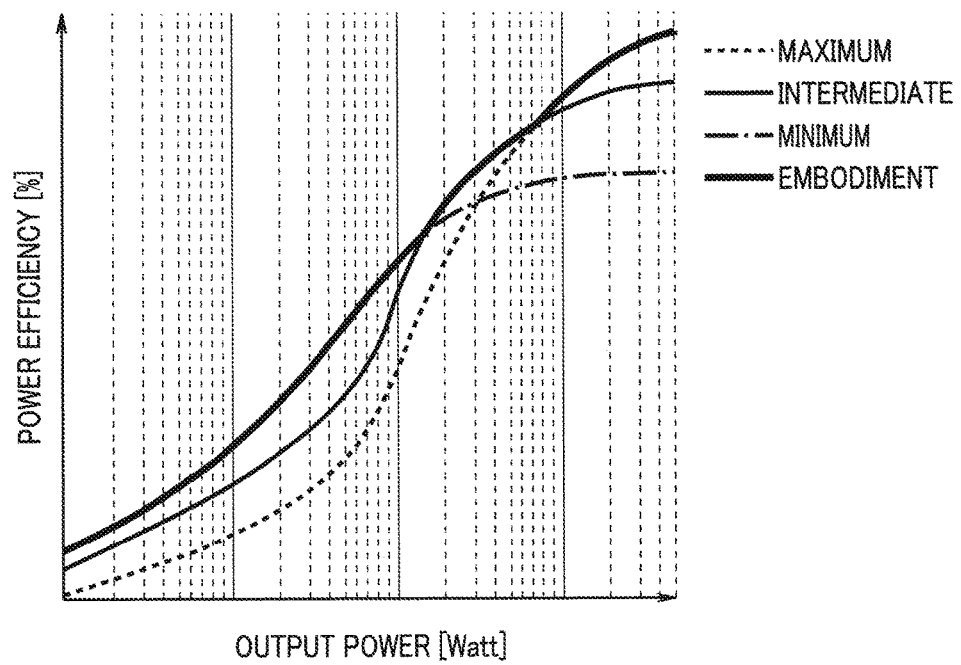
FIG. 16 is a graph illustrating the characteristic in FIG. 14 and illustrating the characteristic of the present embodiment by the thick line.

Next, an example of optimizing the control signal will be described with reference to FIG. 12 to FIG. 16. FIG. 12 is a block diagram illustrating another specific configuration example of the control circuit 20 adopted in the second embodiment. FIG. 13 is a graph representing the output power on the horizontal axis, representing the output loss on the vertical axis and illustrating the relation between the transistor size and the loss, and FIG. 14 is a graph representing the output power on the horizontal axis, representing the efficiency on the vertical axis and illustrating the relation between the transistor size and the efficiency. FIG. 13 and FIG. 14 illustrate the same characteristic as the characteristic of the solid line in FIG. 4 by the solid line, illustrate the same characteristic as the characteristic of the broken line in FIG. 4 by the broken line, and illustrate the characteristic in the case of adopting the output transistor of the transistor size smaller than the transistor size by which the characteristic of the solid line in FIG. 4 can be obtained by a dashed line. In addition, FIG. 15 and FIG. 16 are graphs illustrating the characteristics in FIG. 13 and FIG. 14 respectively and illustrating the characteristic of the present embodiment by the thick line.

In the present embodiment, each transistor size (gate width) of the first transistor group MA is sufficiently small, and the characteristic of the dashed line in FIG. 13 and FIG. 4 is obtained in the case of operating only the first transistor group MA. In addition, the characteristic of the solid line in FIG. 13 and FIG. 14 is obtained in the case of operating the first transistor group MA and the second transistor group MB, and the characteristic of the broken line in FIG. 13 and FIG. 14 is obtained in the case of operating the first transistor group MA, the second transistor group MB and the third transistor group MC. Note that the power at an intersection of the characteristic of the dashed line and the characteristic of the solid line in FIG. 13 is defined as first loss matching power, and the power at the intersection of the characteristic of the solid line and the characteristic of the broken line in FIG. 13 is defined as the second loss matching power.

As the control circuit 20, a threshold level determination circuit 47 illustrated in FIG. 12 is adopted. In FIG. 12, analog sound input is given to the threshold level determination circuit 47. The threshold level determination circuit 47 includes a memory, not illustrated, that stores a first threshold and a second threshold of the input level corresponding to the first and second loss matching power. The threshold level determination circuit 47 compares the inputted sound input and the first and second thresholds, and outputs the control signal of two bits indicating whether the sound input level is equal to or lower than the first threshold, is higher than the first threshold and equal to or lower than the second threshold, or exceeds the second threshold.

The control signal is given to the level shift circuit 40$p$ and the selectors 41$p$H and 41$p$L. Note that, in this case, the minimum mode is set by the control signal indicating the sound input equal to or lower than the first threshold corresponding to the first loss matching power, the intermediate mode is set by the control signal indicating the sound input higher than the first threshold corresponding to the first loss matching power and equal to or lower than the second threshold corresponding to the second loss matching power, and the maximum mode is set by the control signal indicating the sound input exceeding the second threshold corresponding to the second loss matching power.

Now, it is assumed that the sound input equal to or lower than the first threshold corresponding to the first loss matching power is inputted. In this case, the threshold level determination circuit 47 detects that the input level of the sound input is equal to or lower than the first threshold, and outputs the control signal for specifying the minimum mode. The control signal is given to the level shift circuit 40$p$ and the selectors 41$p$H and 41$p$L. Since the minimum mode is set, the selectors 41$p$H and 41$p$L do not output the input of the IN2 terminal. Therefore, in this case, only the gate drivers 42$p$HA and 42$p$LA are operated, the transistor M4A is driven by the positive phase high side PWM pulse, the transistor M3A is driven by the positive phase low side PWM pulse, the negative phase transistor M2A, the illustration of which is omitted, is driven by the negative phase high side PWM pulse, and the transistor M1A is driven by the negative phase low side PWM pulse.

Therefore, in this case, since only the first transistor group MA is operated, the characteristic illustrated by the dashed line in FIG. 13 is obtained. In FIG. 15, the characteristic is illustrated by the thick line.

Next, it is assumed that the level of the sound input rises and the sound input higher than the first threshold corresponding to the first loss matching power and equal to or lower than the second threshold corresponding to the second loss matching power is inputted. Then, the threshold level determination circuit 47 detects that the input level of the sound input exceeds the first threshold and is equal to or lower than the second threshold, and outputs the control signal for specifying the intermediate mode. Thus, the selectors 41$p$H and 41$p$L output the PWM pulse inputted to the IN2 terminal to the gate drivers 42$p$HB and 42$p$LB respectively. Therefore, in this case, not only the gate drivers 42$p$HA and 42$p$LA but also the gate drivers 42$p$HB and 42$p$LB are operated. Thus, the transistors M4A and M4B are driven by the positive phase high side PWM pulse, the transistors M3A and M3B are driven by the positive phase low side PWM pulse, the negative phase transistors M2A and M2B, the illustration of which is omitted, are driven by the negative phase high side PWM pulse, and the transistors M1A and M1B are driven by the negative phase low side PWM pulse.

Therefore, in this case, since the first transistor group MA and the second transistor group MB are operated, the characteristic illustrated by the solid line in FIG. 13 is obtained. In FIG. 15, the characteristic is illustrated by the thick line.

Next, it is assumed that the level of the sound input rises further, and the sound input higher than the second threshold corresponding to the second loss matching power is inputted. Then, the threshold level determination circuit 47 detects that the input level of the sound input exceeds the second threshold, and outputs the control signal for specifying the maximum mode. Thus, the selectors 41$p$H and 41$p$L output the PWM pulse inputted to the IN2 terminal to the gate drivers 42$p$HB, 42$p$LB, 42$p$HC and 42$p$LC respectively. Therefore, in this case, all the gate drivers 42$p$HA and 42$p$LA to 42$p$HC and 42$p$LC are operated. Thus, the transistors M4A, M4B and M4C are driven by the positive phase high side PWM pulse, the transistors M3A, M3B and M3C are driven by the positive phase low side PWM pulse, the negative phase transistors M2A, M2B and M2C, the illustration of which is omitted, are driven by the negative phase high side PWM pulse, and the transistors M1A, M1B and M1C are driven by the negative phase low side PWM pulse.

Therefore, in this case, since all of the transistors M1A-M4A to the transistors M1C-M4C are operated, the characteristic illustrated by the broken line in FIG. 13 is obtained. In FIG. 15, the characteristic is illustrated by the thick line.

As illustrated by the thick line in FIG. 15, in the entire period including the practical use area and the clip period, the class-D amplifier in the present embodiment is operated with the relatively small loss. In addition, as illustrated by the thick line in FIG. 16, in the entire period including the practical use area and the clip period, the class-D amplifier in the present embodiment is operated with the relatively high efficiency.

In this way, in the present embodiment, the effects similar to the effects of the first embodiment are obtained, and since the transistor size of the output transistor can be changed in three ways, the loss is suppressed more surely, and the drive with the high efficiency is made possible.

Third Embodiment

Figure 17:
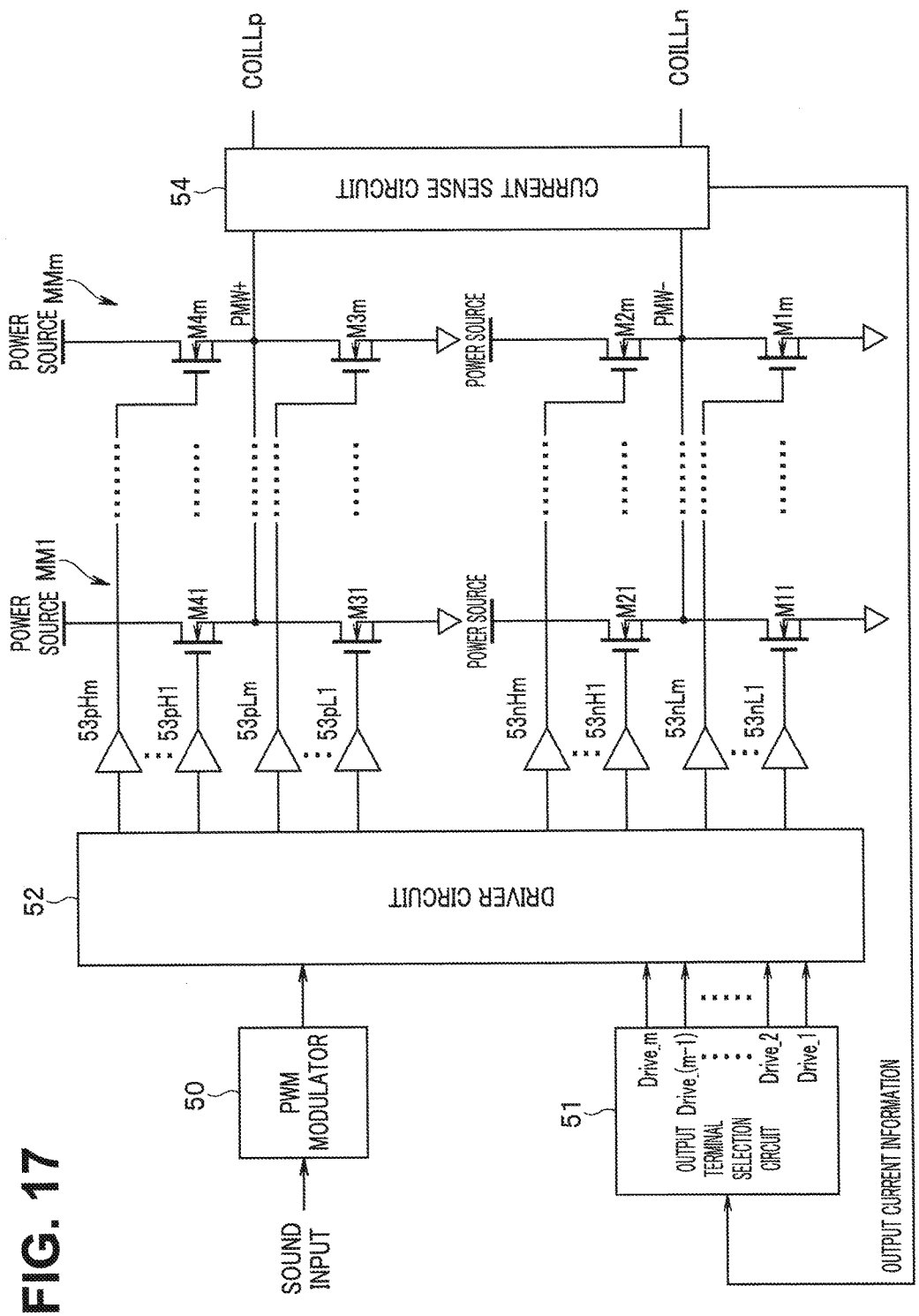
FIG. 17 is a circuit diagram illustrating a third embodiment of the present invention.

FIG. 17 is a circuit diagram illustrating the third embodiment of the present invention. In FIG. 17, for the simplification of the drawing, the configuration similar to the dead time generation circuit 14$p$, the level shift circuit 40$p$ and the selectors 41$p$H and 41$p$L in FIG. 10 is illustrated by a driver circuit 52. While the selectors 41$p$H and 41$p$L output the PWM pulse from the OUT1 and OUT2 terminals, the driver circuit 52 can output the PWM pulse from output terminals of m systems.

In the second embodiment, by configuring each output transistor by three transistors connected in parallel and controlling a parallel connection number of the transistors to be driven, the gate width of the transistor is made changeable. In contrast, in the present embodiment, by configuring each output transistor by m pieces of transistors connected in parallel and controlling the parallel connection number of the transistors to be driven, the transistor size is finely controlled and the loss can be surely suppressed.

Between the power source and the reference potential point, the drain/source path of an output transistor M41 and a drain/source path of a transistor M31 are connected in series. The drain/source paths of (m−1) pieces of output transistors M42-M4$m$ are connected in parallel to the drain/source path of the output transistor M41, and the drain/source paths of (m−1) pieces of output transistors M32-M3$m$ are connected in parallel to the drain/source path of the output transistor M31. The sources of the transistors M41-M4$m$ and the drains of the transistors M31-M3$m$ are connected in common and configure the positive phase output end.

Between the power source and the reference potential point, the drain/source path of an output transistor M21 and a drain/source path of a transistor M11 are connected in series. The drain/source paths of (m−1) pieces of output transistors M22-M2$m$ are connected in parallel to the drain/source path of the output transistor M21, and the drain/ source paths of (m−1) pieces of output transistors M12-M1m are connected in parallel to the drain/source path of the output transistor M11. The sources of the transistors M21-M2m and the drains of the transistors M11-M1m are connected in common and configure the negative phase output end.

In the present embodiment, a transistor group by transistors M4s-M1s (s=1 to m) is referred to as a transistor group MMs. By appropriately setting the gate width of each output transistor of the transistor group MMs and appropriately changing the transistor group MMs to be driven, the transistor size can be finely controlled.

In the present embodiment, instead of the control circuit 20 in FIG. 10, a current sense circuit 54 and an output terminal selection circuit 51 are adopted. The current sense circuit 54 detects the current flowing to the positive phase output end and the negative phase output end, and supplies a detection result (output current information) to the output terminal selection circuit 51. By calculating the output power by the current detected by the current sense circuit 54, and comparing the output power with first to (m−1)th thresholds corresponding to first to (m−1)th loss matching power stored in the memory not illustrated, the output terminal selection circuit 51 generates m pieces of the control signals for respectively controlling the drive of the transistor group MM1 to the transistor group MMm so as to be the transistor size that minimizes the power loss. The output terminal selection circuit 51 outputs the m pieces of the control signals respectively from Drive_1-Drive_m terminals to the driver circuit 52.

The driver circuit 52 drives gate drivers 53nL1, 53nH1, 53pL1 and 53pH1 to the gate drivers 53nLm, 53nHm, 53pLm and 53pHm, respectively, based on the m pieces of the control signals outputted from the Drive_1-Drive_m terminals. The gate drivers 53nL1, 53nH1, 53pL1 and 53pH1 to the gate drivers 53nLm, 53nHm, 53pLm and 53pHm give the inputted PWM pulse to the gates of the transistors M11, M21, M31 and M41 to the transistors M1m, M2m, M3m and M4m respectively and drive the transistors.

In the embodiment configured in this way, the current sense circuit 54 detects an output current flowing to the positive phase output end and the negative phase output end. The output terminal selection circuit 51 calculates the output power by the detection result. As described above, due to a difference in the transistor size of the output transistor, the characteristic of the output power and the power loss changes. As a result, for the two characteristics of the different transistor sizes, characteristic curves intersect at the loss matching power at which the loss matches as illustrated in FIG. 4, and in the case that the transistor sizes change in m pieces, (m−1) pieces of the loss matching power at which the loss matches between the adjacent transistor sizes with each other are provided as illustrated in FIG. 13.

The output terminal selection circuit 51 generates the control signal to determine the transistor group to be driven by comparing the first-(m−1)th thresholds corresponding to the first-(m−1)th loss matching power stored in the memory not illustrated and the calculated output power. The output terminal selection circuit 51 generates the control signal so as to minimize the power loss, similarly to the second embodiment.

The driver circuit 52 drives the gate drivers 53nL1, 53nH1, 53pL1 and 53pH1 to the gate drivers 53nLm, 53nHm, 53pLm and 53pHm based on the control signal, and gives the inputted PWM pulse to the gates of the transistors M1, M21, M31 and M41 to the transistors M1m, M2m, M3m and M4m. Thus, the transistor groups MM1-MMm are selectively driven so as to minimize the loss.

In this way, in the present embodiment, the effects similar to the effects of the first and second embodiments are obtained, and by finely controlling the transistor size of the output transistor, the power loss can be finely controlled.

Note that, in the respective embodiments described above, the example of changing the loss characteristic by increasing or reducing the transistor groups to be driven among the plurality of transistor groups is illustrated; however, the loss characteristic may be changed by switching the transistor groups to be driven among the plurality of transistor groups. In this case, for example, in the case of configuring the output transistor by the three transistor groups, the transistor size can be switched in eight ways at most including the state of not driving all of the transistor groups.

In addition, in the respective embodiments described above, the example of configuring the class-D amplifier by a differential circuit is illustrated; however, it is clear that the class-D amplifier can be configured similarly by a single end type.

Furthermore, in the respective embodiments described above, the example of configuring the high side transistor of the class-D amplifier by an N channel type is illustrated; however, it is clear that the transistor can be configured similarly by a P channel type.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A class-D amplifier comprising:
   a PWM modulator including a comparator configured to compare an input signal and a carrier, and configured to output a PWM pulse based on the input signal;
   a first output transistor group constituted of complementarily operated two first output transistors, a connection point of which is an output end of the two first output transistors;
   a second output transistor group constituted of complementarily operated two second output transistors, a connection point of which is connected to the connection point of the first transistors;
   a driver circuit capable of driving the first output transistors and the second output transistors of the first and second output transistor groups, based on the PWM pulse from the PWM modulator; and
   a control circuit configured to generate a control signal for operating at least one of the first output transistor group and the second output transistor group.

2. The class-D amplifier according to claim 1,
   wherein the control circuit generates the control signal based on a comparison between a level of the input signal or a signal level appearing at the output end and a predetermined threshold.

3. The class-D amplifier according to claim 1,
   wherein the control circuit generates the control signal based on whether or not a level of the input signal or a signal level appearing at the output end reaches a level corresponding to an overmodulation state.

4. The class-D amplifier according to claim 1,
wherein the control circuit generates the control signal based on whether or not a level of a signal appearing at the output end is fixed.

5. The class-D amplifier according to claim 1, comprising one or more output transistor groups including complementarily operated two output transistors, in which a connection point of the two output transistors of each of the output transistor groups is connected to the connection point of the first transistors,
wherein the control circuit generates the control signal for operating at least one of the first output transistor group, the second output transistor group and the one or more output transistor groups.

6. The class-D amplifier according to claim 1, further comprising:
a third output transistor group constituted of complementarily operated two third output transistors, a connection point of which is an output end of the two third output transistors; and
a fourth output transistor group constituted of complementarily operated two fourth output transistors, a connection point of which is connected to the connection point of the third transistors,
wherein the driver circuit drives the first output transistors and the second output transistors of the first and second output transistor groups based on the PWM pulse of a positive phase from the PWM modulator, and drives the third output transistors and the fourth output transistors of the third and fourth output transistor groups based on the PWM pulse of a negative phase from the PWM modulator, and
the control circuit generates the control signal for operating at least one of the first and the third output transistor groups; and the second and fourth output transistor groups.

7. The class-D amplifier according to claim 1,
wherein the first output transistors are constituted of an output transistor for a high side operated based on a positive phase high side PWM pulse from the PWM modulator and an output transistor for a low side operated based on a positive phase low side PWM pulse from the PWM modulator, and
the second output transistors are constituted of an output transistor for the high side operated based on the positive phase high side PWM pulse from the PWM modulator and an output transistor for the low side operated based on the positive phase low side PWM pulse from the PWM modulator.

8. The class-D amplifier according to claim 6,
wherein the first output transistors are constituted of an output transistor for a high side operated based on a positive phase high side PWM pulse from the PWM modulator and an output transistor for a low side operated based on a positive phase low side PWM pulse from the PWM modulator,
the second output transistors are constituted of an output transistor for the high side operated based on the positive phase high side PWM pulse from the PWM modulator and an output transistor for the low side operated based on the positive phase low side PWM pulse from the PWM modulator,
the third output transistors are constituted of an output transistor for the high side operated based on a negative phase high side PWM pulse from the PWM modulator and an output transistor for the low side operated based on a negative phase low side PWM pulse from the PWM modulator, and
the fourth output transistors are constituted of an output transistor for the high side operated based on the negative phase high side PWM pulse from the PWM modulator and an output transistor for the low side operated based on the negative phase low side PWM pulse from the PWM modulator.

9. The class-D amplifier according to claim 7, further comprising
a dead time generation circuit configured to provide dead time in the positive phase high side PWM pulse and the positive phase low side PWM pulse from the PWM modulator, in order to prevent simultaneous conduction of the two first output transistors and simultaneous conduction of the two second output transistors.

10. The class-D amplifier according to claim 8, further comprising:
a positive phase dead time generation circuit configured to provide dead time in the positive phase high side PWM pulse and the positive phase low side PWM pulse from the PWM modulator, in order to prevent simultaneous conduction of the two first output transistors and simultaneous conduction of the two second output transistors; and
a negative phase dead time generation circuit configured to provide dead time in the negative phase high side PWM pulse and the negative phase low side PWM pulse from the PWM modulator, in order to prevent simultaneous conduction of the two third output transistors and simultaneous conduction of the two fourth output transistors.

* * * * *